United States Patent [19]

Ragge et al.

[11] Patent Number: 5,597,471
[45] Date of Patent: Jan. 28, 1997

[54] SOLUTION FOR COATING NON-CONDUCTORS WITH CONDUCTIVE POLYMERS AND THEIR METALLIZATION PROCESS

[75] Inventors: Andrea Ragge; Heinrich Meyer; Gonzalo Urrutia Desmaison, all of Berlin, Germany

[73] Assignee: Atotech Deutschland GmbH, Berlin, Germany

[21] Appl. No.: 387,917

[22] PCT Filed: Aug. 20, 1993

[86] PCT No.: PCT/DE93/00789

§ 371 Date: Apr. 11, 1995

§ 102(e) Date: Apr. 11, 1995

[87] PCT Pub. No.: WO94/04591

PCT Pub. Date: Mar. 3, 1994

[30] Foreign Application Priority Data

Aug. 20, 1992 [DE] Germany ............... 42 27 836.8

[51] Int. Cl.⁶ .............. C25D 5/54; C25D 5/56; C25D 7/00
[52] U.S. Cl. ............ 205/159; 205/160; 205/162; 205/164; 205/166; 205/920; 205/925
[58] Field of Search .................... 205/125, 159, 205/160, 162, 164, 166, 920, 925, 183, 317

[56] References Cited

U.S. PATENT DOCUMENTS

| | | | |
|---|---|---|---|
| 4,617,228 | 10/1986 | Newman et al. | 428/265 |
| 4,959,162 | 9/1990 | Armes et al. | 252/519 |
| 5,194,313 | 3/1993 | Hupe et al. | 428/137 |
| 5,415,762 | 5/1995 | Allardyce et al. | 205/166 |

FOREIGN PATENT DOCUMENTS

| | | |
|---|---|---|
| 0129070 | 12/1984 | European Pat. Off. . |
| 0241728 | 10/1987 | European Pat. Off. . |
| 0413109 | 2/1991 | European Pat. Off. . |
| 0432929 | 6/1991 | European Pat. Off. . |
| 0457180 | 11/1991 | European Pat. Off. . |
| 587204 | 3/1994 | European Pat. Off. . |
| 3806884 | 9/1989 | Germany . |
| 3939676 | 5/1991 | Germany . |
| WO91/08324 | 6/1991 | WIPO . |

OTHER PUBLICATIONS

Abstract of JP2240139 A. Published Sep. 25, 1990.

*Primary Examiner*—Bruce F. Bell
*Assistant Examiner*—Edna Wong
*Attorney, Agent, or Firm*—Cohen, Pontani, Lieberman, Pavane

[57] ABSTRACT

A process for metallizing non-conductive surfaces, by treating the non-conductive surface with a solution containing at least one suspended or solute oxidation agent, contacting the treated non-conductive surface with an acidic solution containing at least one water soluble polymer selected from the group consisting of homopolymers and copolymers, and at least one aromatic compound which chemically polymerizes the water-soluble polymer and the aromatic compound to form a conductive polymer, and electroplating the conductive polymer. Each water-soluble polymer contains uncharged structural elements or is cationic polyelectrolyte. Additionally, each water soluble polymer is capable of protonizing/deprotonizing reactions, formation of hydrogen bridge compounds and van der Waals interactions.

18 Claims, No Drawings

SOLUTION FOR COATING NON-CONDUCTORS WITH CONDUCTIVE POLYMERS AND THEIR METALLIZATION PROCESS

This application is a 371 of PCT/DE93/00780 filed Aug. 20, 1993.

BACKGROUND OF THE INVENTION

1. Field of the Invention

The invention relates to a solution as well as to a process for metallizing non-conductors using conductive polymers.

It is known to process non-conductive surfaces in the following steps:

a) Process with a solution containing suspended or solute oxidation agents, so that an oxidation agent is adsorbed or created on the non-conductive surface.

b) Process with a solution containing at least one aromatic compound, which can be converted through oxidation into a conductive polymer, and at least one water-soluble polymer.

c) Metallize through electroplating.

2. Discussion of the Prior Art

In DE 38 06 884 C1 and EP 0 413 109 A2, processes of this type using conductive polymers for the metallization of non-conductors are described. What is crucial in both processes is that the otherwise necessary intermediate step of chemical metallization may be omitted and that electroplating is achieved in a shorter process.

The processes described above have technical disadvantages, however. According to DE 38 06 884 C1, the monomer needed to produce the conductive polymer is adsorbed on brownstone, and the acid required for polymerization is not added until after this has occurred. This sequence results in the quantity of monomer being limited both by its adsorption capacity on brownstone and by the quantity of brownstone on the non-conductive surface. This can lead either to insufficient polymerization through oxidation of the monomer or to over-oxidation, so that the requisite process reliability is not guaranteed.

In the process described in DE 38 06 884 C1, the post-treatment step with acid constitutes the essential step in polymerizing the monomer into the conductive polymer, because an acid is needed along with the oxidation agent for the chemical expression of a conductive polymer. This sequence of steps results in a longer process. Furthermore, in this process, volatile solvents are used together with the volatile pyrrole. This pollutes the environment and impairs occupational safety, because in order to achieve adequate polymerization a high concentration of the monomer must be used in the solution, meaning that solubilizers must be added to the solution when water is used as the preferred solvent.

In contrast, the process according to EP 0 413 109 A2 uses already finished polyaniline, which is applied by coating to the non-conductive surface. In addition to the requisite prior synthesis of the polyaniline, the selectivity of the process and the not always adequate adhesion of the polymer layer to the non-conductive surface constitute significant problems of this process.

In DE 39 39 676 A1 and EP 0 457 180 A2, a process for metallization is described which is based on the process steps:

pre-swelling in organic solvents etching with permanganate pyrrolic polymerization in acid metallization.

This process does not use the oxidative spectrum of the permanganate to produce sufficient oxidation agent; an additional pre-treatment step with organic solvents is required. The use of N-methylpyrrolidone in the swelling step is disadvantageous because of the limited retention time of the swelling bath, since the compound has only low acid stability. The temperatures specified in both documents for the pyrrolic polymerization bath are not optimal for an even conductive layer. In addition, the volatility of the solvent and the pyrrole used in these processes also presents a problem, because their emission from processing equipment pollutes the environment and reduces occupational safety.

In U.S. Pat. No. 4,617,228 a process is described for the impregnation of porous substrate materials, e.g., glass fiber fabric, in which a liquid pyrrole compound and a solution of a strong oxidation agent are brought into contact sequentially with the substrate material in the presence of a non-nucleophilic anion. Conductivity in the carrier material is attained through the precipitated conductive layer of conductive polymer. Neither further electroplating metallization of the conductive polymer layer nor electrical resistance values of the conductive polymer layer are disclosed, so that there is no way to tell whether a sufficient electroplating capability even exists.

In JP 63 125696 A, the plating of non-conductors using a chemically manufactured polypyrrole film and subsequent electroplating is described. The polyvinyl alcohol specified in this document serves as an impregnation agent and is added as a solvent in the function of a matrix for the organic conductor. Polymerization occurs in the condensed matrix of the impregnation agent polyvinyl alcohol. The in situ expression of the oxidation agent, which-like brownstone-adheres tightly to the non-conductive surface, is not described. As an example, the reaction of iron-Ill-chloride in a pre-generated matrix with pyrrole is described. The document also does not point to any solution for the problem of the volatility of the aromatic compound that can be oxidized to a conductive polymer.

In industrial use of these solutions, it has been shown that the aforementioned aromatic compounds, such as pyrrole, for example, have a relatively high vapor pressure, so that during longer operation black deposits are formed on any surfaces in the area of containers containing these solutions, arising from the smallest traces of acids, the atmospheric oxygen and the gaseous compound added thereto.

To prevent emission of the aromatic compounds, treatment solutions of this type are known to be used according to the prior art in closed units. However, this is complicated and expensive and, furthermore, economically feasible only when certain otherwise advantageous processing techniques can be used, for example, during the horizontal conveying of printed circuit boards during their through-hole plating.

SUMMARY AND DESCRIPTION OF THE INVENTION

Starting from the prior art, the invention is therefore based on the problem of developing a solution with which, in a suitable process, well-conducting polymer layers can be produced for the subsequent metallization of technically relevant non-conducting substrate materials and with which, in particular, the reliable through-hole plating of printed circuit boards is possible, while heavy emission of aromatic compounds is avoided.

In addition, the process is to be suitable for area metallization and is to achieve even and complete metallization with high selectivity. This refers to the requirement that the conductive polymer be deposited only on the non-conductive surfaces of the non-conductor, not on the conductive areas, such as the copper surfaces on circuit boards, for example.

In addition to the aromatic compounds needed to produce the conductive polymers, the solution according to the invention contains water-soluble polymers, which are homopolymers and/or copolymers.

In the framework of the invention, copolymers refer to mass polymers which contain larger molecular regions with identical repeating units. Biopolymers such as gelatine and anionic polyelectrolyte lie outside of the realm of the invention. The water-soluble polymer serves to lower the vapor pressure of the aromatic compound. Aqueous solutions, for example, of pyrrole, suffer a constant depletion of monomer through vaporization losses. If water-soluble polymers are added to the monomer solution, the emission of pyrrole can be reduced.

Suitable water-soluble polymers are compounds which are capable, in particular, of forming hydrogen bridges or of forming sufficiently adsorptive and van der Waals interactions. In addition, the compounds can preferably enter into protonizing/deprotonizing reactions in aqueous solutions.

Without being bound by theoretical considerations, it can be presumed that the claimed group of homopolymeric and copolymeric water-soluble compounds are especially capable of forming the necessary chemical interactive forces with the relatively rigid chains of conductive polymers and their predecessors, the monomer and oligomer aromatic compounds, because they contain large regions of similar structural elements with recurring repeating units. When these monotonously structured structure regions include the functional groups needed for the aforementioned chemical interactions, such as ether groupings, for example, then lower vapor pressure of the aromatic compound in the acid solution as well as sufficiently high conductivity of the conductive polymer layer are achieved.

With biopolymers—for example, gelatine, which is a polyamine acid having many different structural elements, wherein the individual amino acid units are statistically distributed within the gelatine molecule—only insufficient formation of the necessary strong chemical interactive forces is possible, since layering of the conductive polymer chains with these polymer compounds cannot occur due to the incompatibility of the spatial structures of the conductive polymer chains and the compounds. The addition of these compounds therefore produces conductive polymer layers with lower electrical conductivity.

Water-soluble polymers which have exclusively or predominately uncharged structural elements in the polymer framework or are cationic polyelectrolyte are therefore especially suitable. These include compounds which contain one or more hydroxyl, amide, sulfonamide, amine-ketoenole, ether, keto, sulfoxide, quaternary ammonia and/or hetarinium groups in the molecule. In the framework of the present invention, hetarinium groups refer to heteroaromatics containing nitrogen with a positive charge for the nitrogen, such as, for example, imidazolium or benzimidazolium compounds.

It has been found that compounds of the groups polyalkylene oxides, polyalkylene imines, polyvinyl pyridines, polyvinyl pyrrolidones, polyacrylic amide, polyvinyl alcohol as well as polymers produced from epihalohydrine and imidazoles or benzimidazoles, polymers produced from acrylic acid or methacrylic acid compounds derived with quaternary ammonia groups, poly(diallydimethyl ammonia halogenide), quaternized polypiperidinium compounds, polyamine sulfones, quaternized polyvinylimidazolium salts, quaternized polyvinylpyridinium salts, [ionenes] and their derivates can be especially advantageously used. The halogenides mentioned refer in particular to chlorides, bromides and iodides.

Typical representatives of water-soluble polymers which can be used to attain the object are:

polyethyleneimine poly(N-methyl-ethyleneimine), polyvinyl alcohol polyethylene oxide polypropylene oxide copolymer of polyethylene oxide and polypropylene oxide polyacrylic amide poly-1-vinylpyrrolidone poly(2-vinylpyridine)

poly(4-vinylpyridine)

polyethylene glycol poly(N-methyl-N-vinylimidazolium methosulfate)

polyamine sulfones poly(N,N-dimethyl-3,5-dimethylene-piperidinium chloride)

poly((3-chlor-2-hydroxy propyl)-1-imidazole)

poly(N,N-diallyldimethylammonia chloride).

A summary of the water-soluble polymers which can be used is found in "Water-Soluble Polymers" by Y. L. Meltzer, Noyes Data Corporation (1972). These include, in addition to the above compounds and compound classes, the following compounds, among others: polyepihalohydrine as a hydroxyl-, amine- or heterocyclical derivative and polyacrylic amide or its alkyl-, alkylamine-, alkyloxy- or alkylcarboxy derivates substituted for nitrogen. Many of these polymers are available commercially.

The concentration of water-soluble polymers in the acidic solution should not fall below a value of 2 g/l, in order to achieve the described effects of the additive. A concentration range between 2 g/l and 250 g/l has proved to be advantageous. Excessively high concentrations lead to excessive consumption of the water-soluble polymers due to carry-over of the solution. This would lead to high costs for raw materials and to additional expenditures for waste water processing.

The temperature of the acidic solution is preferably set between the freezing point of the solution, approximately −10° C., and approximately +30° C. The upper temperature limit is based on the fact that the stability of the solution declines clearly at excessively high temperatures, because there is spontaneous decomposition of the aromatic compounds.

The pH-value of the acidic solution is preferably set between pH 0 and pH 4. Stronger acidic solutions lead, like excessively high temperatures, to instable solutions. A solution with a pH value above 4 is not able to deposit any conductive polymer at a sufficient rate.

The process preferably used for metallizing non-conductive surfaces, in which the solution according to the invention is used, consists of the following steps:

1. The non-conductor surface is pre-treated with the objective of producing or adsorbing oxidation agent on the non-conductor surface.

2. The pre-treated substrate material is treated with the solution according to the invention, which contains the water-soluble polymers and the aromatics, which are polymerized to an intrinsically conductive polymer through oxidation with the oxidation agent formed in Step 1 on the non-conductor surface. A conductive layer is thereby formed.

3. The previously insulating and now conducting areas are metallized in an electroplating bath.

As substrate materials (non-conductors), plastics and glass-fiber reinforced resins or polymers, which are accessible to a pre-treatment through swelling and etching, may be used. These include polycarbonates, acrylonitrile-butadiene-styrene copolymers (ABS), cyanate ester, phenol resin (FR12), epoxy bonded paper (FR3) and, in particular, glass-fiber reinforced epoxy resin (FR4). The type designations commonly used in trade are given in parentheses.

In a preferred design form, the substrate material, preferably glass-fiber reinforced epoxy resin, is oxidatively treated with potassium permanganate in an alkali solution. This step, which is standardly used in the production of printed circuit boards in order to clean the surface, has the expanded function in the process according to the invention of producing the oxidation agent needed for the oxo-polymerization of the aromatic compound to intrinsically conductive polymers, i.e., the brownstone (manganese IV and/or III oxide, manganese dioxide/hydroxide). These functions are also carried out by manganates such as sodium manganate, for example, in that they constitute an active species during oxidation with permanganate and, on the other hand, also form brownstone in alkali solution. The manganate stage is reliably an active species at the temperatures usual in practice and longer operating times, because potassium manganate can be expressed from potassium permanganate and potassium hydroxide at 100° C.

The oxidation solution should possess regular and adequate activity. In practice, however, fluctuating concentration is to be reckoned with. The oxidation solutions can be better controlled and require no incorporation time when, in further development of the invention, high concentrations of permanganate and alkali are set and the consumed manganate is reformed through cooking. The result of the oxidative cleaning is, in any case, the stable intermediate stage brownstone. It is especially important to obtain the brownstone created at the reaction site as a reaction product in sufficient quantity.

It is advantageous to co-adsorb the microcrystalline brownstone which increasingly accumulates at the reaction site. The brownstone quantity may also be increased, if needed, by the addition of manganese sulfate.

An alternative way to obtain oxidation agent according to the invention is to bring the substrate material into contact with a solution of iron-III-chloride, e.g., in propylene carbonate, water, ethylene glycol, N-methyl pyrrolidone or other polar solvents, for example, by dipping.

As the aromatic compounds used as monomeric pre-stages for the conductive polymers according to the invention, especially pyrrole N-phenyl-p-phenylene diamine, aniline and thiophene as well as dimers and derivatives of these monomers may be used. For example, as pyrrole derivates 3- and/or 4-mono- or disubstituted pyrrole derivates as well as linked monomer pyrroles in the 2-,2' position, and preferably 2,2' bipyrrole may be used. The thiophene derivates include linked monomeric thiophenes in the 2-,2' position, preferably 2,2' bithiophene. The aniline derivate in the o- and/or m-position and the N-phenyl-p-phenylene diamine derivate may be substituted symmetrically or asymmetrically in the 2,2' and/or 5,5' and/or 3,3' and/or 6,6' position. The chemistry of conductive polymers is described in detail by Skotheim in the "Handbook of Conducting Polymers," Dekker, 1986. To be sure, the literature does not indicate which reaction mechanism the chemical polymerization has. The inventors found that the quantity of conductive polymers formed is determined by the quantity of brownstone or iron-III-chloride.

After brownstone in the desired quantity is produced in situ or iron-III-chloride is adsorbed on the non-conductor surface in the first process step, the non-conductor surface is pretreated in the present invention with a monomer-containing acidic solution of a water-soluble polymer.

The monomer provided by the solution thereby reacts on the brownstone surface of the pre-treated non-conductor and oxo-polymerizes to intrinsically conductive polymer.

The water-soluble polymer contained in the solution enters into chemical interactions with the aromatic pre-stage of the conductive polymers in the solution and at the same time adsorbs with the aromatic compound on the surface of the non-conductor surface occupied by the oxidation agent.

Because the created brownstone is immediately available to react with the acidic solution of the monomer and the water-soluble polymer, the disadvantage of an inadequately reliable process according to the prior art is avoided. Polymer can be created only in the amount that oxidation agent is available, and oxidation agent can be produced in the amount required by the desired quantity of polymer and/or the conductivity. The danger of over-oxidation does not exist. In addition, no oxidation agent residues can remain in the substrate, because the oxides are consumed and converted into soluble compounds in lower oxidation stages.

Surprisingly, it is found that the addition of the water-soluble polymers according to the invention also makes it possible for many different materials to be coated next to one another and then thickly metallized without process conditions having to be changed. This is required, for example, during the through-hole plating of printed circuit boards, because the polymer surface of the circuit board material as well as the glass fiber ends which extend into the borings must be coated equally well.

On the one hand, brownstone scarcely forms on glass, nor is it adsorbed to any significant extent; on the other hand, the rigid chains of the conductive polymers are only capable by chance of contributing the necessary contact interaction for physisorption. Water-soluble polymers, in contrast, have a flexible polymer framework and can be provided with the desired adsorptive characteristics, so that the characteristic of being an additive to improve the glass fiber covering can be deliberately set.

The effectiveness of water-soluble polymers for evenly covering the polymer surfaces as well as the glass fiber ends in circuit board borings is described in the "Handbook of Circuit Board Technology" Volume 3, pp. 72–3, ed. by Guenther Herrmann, Eugen G. Leuze Verlag, Saulgau 1993 and measured by transmitted light testing. To this end, the boring, following metallization after polymeric coating, is cut longitudinally and the light transmission of the metal layer is determined by microscope using a strong lighting source which transmits light through the half-area of the drill hole wall from below.

Furthermore, the water-soluble polymers used according to the invention for metallization do not negatively affect the conductivity of the produced polymer layer. This is very important in order to ensure the capability of the layer to be metallized even in a short time span. In the prior art, the problem of the high vapor pressure of the aromatic compound could not be satisfactorily solved, nor could the sufficiently thick metallization of glass fibers after the coating with the conductive polymer or sufficiently good conductivity of the polymer layer be ensured. It is true that EP 0 457 180 A2 and U.S. Pat. No. 4,617,228 indicate that the additive materials described there, such as gelatine or polyvinyl sulfonate, for example, improve the metallization capability of the glass fibers. However, tests have shown that in this case the electrical conductivity of the produced layers is lower than without additives. In addition, the vapor pressure of the aromatic compound is not diminished as desired through the addition of these substances.

A further advantage of using the water-soluble polymer additive is the improved ductility of the conductive polymer layer which results from the incorporation of the water-soluble polymer into the layer. Coatings of conductive polymer are brittle without special measures. In particular, the thermal stress or the mass exchange of ions and water can lead to microcracks. The probability of such defects increases with the layer thickness and becomes greater with electrostatic and mechanical stress on the rigid polymer chains.

After the non-conductor is coated with the conductive polymer, the formed layer is metallized through electroplating. The electroplating deposit of metal is carried out with commercial electroplating baths. In principle, all metals can be deposited, with the standard that the organic conductors do not suffer excessively high reductive initial potentials. Preferred baths are acid-containing baths with pH 0 to 4, for the deposit of copper, especially sulfuric acid copper baths with 10 to 300 g/l free sulfuric acid and a copper content of 5 to 50 g/l.

Electroplating is carried out under the usual current and temperature conditions, for example, at a current density of 0.1 to 20 A/dm$^2$ and a temperature of 20° to 70° C.

Electroplating may be carried out directly after the production of the conductive layer, even without a rinsing step. However, it is also possible to include waiting times or longer drying retention times at room temperature prior to metallization without loss of metallization capability. Depending on geometric requirements, for example, related to the distance between the contacting point and the point at which metallization takes place, it is possible in especially favorable cases for closed area metallization to be evenly achieved within 2 minutes.

The process is usually carried out in vertical dipping units. However, the process may also be carried out in a horizontal processing unit, for example, for the production of printed circuit boards.

The processing solutions can be brought into contact with the substrate material to be treated alternatively through dipping, spurting, spraying or squirting.

In addition to being used for through-hole plating or area metallization of circuit boards, the area metallization of materials by means of the process according to the invention is also suitable for decorative purpose, such as, for example, in sanitary technology or the fittings industry, or for functional uses, such as the manufacture of computer casings shielded against electromagnetic radiation or other casings for electrical devices.

The following examples explain the invention in greater detail.

EXAMPLES

Example 1

To test the dynamic vaporization of the aromatic compound, a solution of 7.7 g/l pyrrole in 1M phosphoric acid in a basin is exposed to vaporization for one hour at 5°±1° C. in a digestorium with an exhaust air output of 640 m$^3$/h. The pyrrole concentration in the solution declined. The losses were tracked by means of UV absorption at 208 nm in the aqueous medium; the loss coefficient was $-3.4 \cdot 10^{-6}$ g/l/min/cm$^2$.

A solution with 100 g/l polyvinyl pyrrolidone K15 (source: Aldrich Co., Germany) led under the same experimental conditions to a clearly lower vaporization rate with a coefficient of $-1.6 \cdot 10^{-6}$ g/l/min/cm$^2$.

With 100 g/l polyethylene glycol the following results were obtained: $-2.5 \cdot 10^{-6}$ g/l/min/cm$^2$.

At a higher air flow, the coefficient of an additive-free solution was $-8.5 \cdot 10^{-6}$ g/l/min/cm$^2$; in contrast, with 203 g/l polyethylene glycol 200 it was only $-3.3 \cdot 10^{-6}$ g/l/min/cm$^2$.

In the following examples, after the metallization of the sample, conductivity measurements were carried out, being performed on gold contacts at a spacing of 1 cm with a coating weight of 1.7 kg with a FLUKE 25 multimeter from the Fluke Co., Germany.

Example 2

A cut-to-size half-sided laminated circuit board of glass-fiber-reinforced epoxy resin was metallized as follows:

1. Oxidative pre-treatment in an aqueous solution with 80 g/l (possible range 20–130 g/l) potassium permanganate and 20 g/l (possible range 10–70 g/l) potassium hydroxide or sodium hydroxide at 80° C. (possible range 40°–100° C.), for preferably 1 min (possible range 0.1–20 min).
2. Rinsing
3. Formation of the conductive layer in a solution of 20 g/l (possible range 0.1. g/l–200 g/l) pyrrole in 1M phosphoric acid or other acids with pH 1 (possible range pH 0–4) at 5° C. (possible range 0°–25° C.) for 5 min. Measured resistance coefficient $1.9 \cdot 10^6$ ohm.
4. Optional rinsing in dilute mineral acid with pH 0 to 2. (Especially for restoration of conductivity after long exposure times of the conductive layer to air, if the process is interrupted between Steps 2 and 3.)
5. Metallization at 0.1–10 A/dm$^2$.

Example 3

Procedure as in Example 2; with 3 minutes longer oxidative pre-treatment, the resistance coefficient was $36 \cdot 10^3$ ohm. Metallization at 1.2 A/dm$^2$.

Example 4

Procedure as in Example 2; the duration of the oxidative pre-treatment was 6 minutes; the measured resistance coefficient was $24 \cdot 10^3$ ohm. Metallization at 1.2 A/dm$^2$.

Example 5

Procedure as in Example 2, but with an oxidation solution more active through long operation; a resistance coefficient of $5 \cdot 10^3$ ohm was obtained. Metallization at 5.2 A/dm$^2$.

Example 6

Based on J. Cornfoth, D. Ming-hui, J. Chem. Soc. Perkin Trans. I, 1459 (1990), 3-methylpyrrole was synthesized starting from 3-ethoxymethacroline and hippuric acid via the 4-methylpyrrole-2-carboxylate through decarboxylization in 5 stages at a lower yield. Boiling point 140°–143° C.

Repetition of Examples 2, 3 and 4 but with 3-methylpyrrole as the monomer led to measured resistance coefficients of 2 to $8 \cdot 10^6$ ohm. Metallization occurred at 1.2 A/dm$^2$.

Example 7

Based on D. O. Cheng, T. L. Bowman, E. LeGoff, J. Heterocyclic Chem. 13, 1145 (1976), 3,4-dimethylpyrrole was synthesized starting from p-toluol-sulfonylmethylisocyanide and crotonic-acid-ethyl-ester. The dimethyl compound was quickly obtained after reduction of the intermediary 3-(ethoxycarbonyl)-4-methylpyrrole, but at only 18% total yield. The material had a melting point of 25°–28° C. H-NMR (CDCl$_3$): 2.04 (s, 6H), 6.50 (d, 2H), 7.33 (s br, 1H).

For metallization, the procedure as in Example 2 was followed, but with 3,4-dimethylpyrrole as the monomer. The resistance coefficient was $1.4 \cdot 10^6$ ohm. Metallization occurred at 1.2 A/dm$^2$.

Example 8

Analogous procedure to that in Example 3, but with use of 0.1N sulfuric acid (pH 1.2) as a solvent at a temperature of 0°–5° C. and with 13.4 g/l pyrrole as the aromatic compound. In addition, the solution contained 11.1 g/l polyvinyl pyrrolidone K15, molar weight 10000, available from the Aldrich Co. The measured resistance coefficient of the layer after 1 hour was $11 \cdot 10^6$ ohm. Metallization occurred at a current density of 2 A/dm$^2$.

Example 9

7.2 g/l pyrrole was used as the layer-active additive at pH 1 in 1M phosphoric acid with 11.1 g/l of a 42% monomer-free aqueous solution of poly(N-methyl-N-vinylimidazolium methosulfate). Polymerization occurred at a temperature of 25° C. and a time period of 5 min. After 4 hours resting in the air, a resistance coefficient of 20 to $50 \cdot 10^3$ ohm was obtained. Metallization led within 2.5 min at a current density of 1.9 A/dm$^2$ to a thick covering of the substrate.

Examples 10–13

Analogous to Examples 2 to 9, very good results were obtained with the following water-soluble polymers:
polyethylene glycol 200 and 1000 (obtained from the Aldrich Co.)
polyvinyl pyrrolidone K15 and K90 (Aldrich Co.)
polyamine sulfones PAS A-5R, PAS A-120LR, PAD 92R, PAS 200R (trade names of the Tozai Boeki Kaisha Company, Japan)
poly(N,N-dimethyl-3,5-dimethylene-piperidinium chloride) (Aldrich Co.).

Examples 14 and 15

Based on Examples 2–13, especially good results were obtained with a pre-cooked oxidative pre-treatment solution of 80 g/l potassium permanganate and 40 g/l caustic soda in water at 90° C. The special nature of the solution could be seen in the blue-green coloring of the rinse water.

Poly ((3-chlor-2-hydroxypropyl)-0-imidazole) was obtained from 34.05 g imidazole and 47.2 g epichlorhydrine in 30 ml ethanol at 10° to 25° C. after 24 hours through crystallization at 10° C. from the reaction solution. C-NMR (D$_2$O): 46.5 (CH$_2$), 53.0 (CH$_2$), 63.3 (CH$_2$), 68.9 (CH), 69.2 (CH), 70.7 (CH), 124 (imidazolium-H), 137.6 (t, imidazolium-D).

Analogous to German Patent Application DD 141028, poly(N,N-diallyldimethylammonia chloride) was synthesized from 150 ml 60% aqueous N,N-diallyldimethylammonia chloride solution with 1.15 g ammonia carbonate with drops of 2.69 g ammonia peroxide sulfate in 10 ml water at 50° C. for 3 hours at 60° to 80° C. The conversion was 98% according to vinyl-H signals. Residual monomer was removed by reprecipitation of acetone.

| Microanalysis: | C | H | N | Cl |
|---|---|---|---|---|
| [Cal.] | 59.4 | 9.9 | 8.6 | 21.6 |
| [Fnd.] | 59.0 | 9.2 | 8.9 | 21.2 |

After 3 minutes at 90° C. in the oxidative pre-treatment solution and 5 minutes in a solution of pyrrole in 1M phosphoric acid with poly((3-chlor-2-hydroxypropyl)-1-imidazole) at 0° to 5° C., metallization of a 4 cm$^2$ large area was carried out at 1 A/dm$^2$ with a thick copper layer in 7 minutes. Similar results were obtained with poly(N, N-diallyldimethyl ammonia chloride).

Examples 16 and 17

Procedure as in Example 9. With 12 g/l 3,4 dimethylpyrrole in 1M phosphoric acid, better results were obtained with use of 12 g/l poly(vinylimidazoliummethosulfate) or 12 g/l poly(N,N-diallyldimethylammonnia chloride) than without addition of these polymers. Measured resistance coefficients: $0.8 \cdot 10^6$ ohm, $2 \cdot 10^6$ ohm, $1 \cdot 10^6$ ohm. Metallization was carried out at 3.7 A/dm$^2$.

Example 18

After hydrophilization of the substrate surface of glass-fiber-reinforced epoxy resin material (FR4 circuit board) with initial smear removal steps usual during circuit board manufacture, moistener/sweller and chromic acid etching, the sample was dipped in a saturated iron-III-chloride solution in propylene carbonate at 20°–40° C., rinsed and then further processed as in Example 2.

Example 19

As in Examples 2, 14, 15, the monomer solution used as 14 to 140 g/l (0.05–300 g/l) aniline in 1N hydrochloric acid (operable pH range 0–2) at preferably 12° C. (0° to 30° C.) for preferably 0.5 minutes (0.1–10 min). Rinsing in 1N hydrochloric acid at 25° C. Resistance coefficient of the dry conductive layers: 30 to $90 \cdot 10^3$ ohm. Metallization occurred at 0.6–10 A/dm$^2$.

Example 20

Unlike in Example 19, the substrate material was treated before the beginning of the process With an organic solvent. The FR4 material was treated for 1–2 minutes with acetic ether at 25° C. and, after thorough rinsing, further treated as in Example 2. Measured resistance coefficient: $5.5 \cdot 10^3$ ohm.

Example 21

Analogous to Example 19, 0.05 g/l 4-aminodiphenylamine as the monomer was treated in 5N hydrochloric acid. The temperature was 0°–5° C. Treatment time was 0.5–5 minutes. Measured resistance coefficients: $4-20 \cdot 10^3$ ohm.

Dry layers displayed resistance coefficients of $0.4–2.2 \cdot 10^6$ ohm.

Examples 22 and 23

The drill holes of two-sided laminated circuit boards were through-plated as in Examples 2–20. In addition, the procedure as in the process sequence of Example 2 was followed, and the conductive layer was formed with the following solutions at a temperature of 5° C. (possible range −10° to +30° C.) within 5 minutes:

A: 4.7 g/l pyrrole, 127 g/l polyethylene glycol 200 in 1M phosphoric acid.

B: 4.6 g/l pyrrole in 1M phosphoric acid.

Metallization resulted after 5 minutes at 2 A/dm² in the following transmitted light results in the drill holes (d0=no errors, d5=metal-free sites):

A: d2/d2/d3

B: d5/d5/d5 (additive-free solution)

The conductive layer was also formed at 20° C. for 5 minutes with the following solutions in:

A: 9 g/l pyrrole, 26.2 g/l polyethylene glycol 200 in 1M phosphoric acid

B: 8.6 g/l pyrrole in 1M phosphoric acid.

Metallization after 2 minutes at 2 A/dm² led to the following transmitted light results in the drill holes:

A: d0/d0/d2

B: d2/d1/d2

In no case did the black polypyrrole layer form on the copper surface.

Example 24

20 g/l gelatine (obtained from the Fluka [sic] Co., Germany), 15.2 g/l ammonia peroxidisulfate and 4.5 g/l pyrrole was added to an agitated sulfuric acid solution (pH 1.5, temperature 10° C.). After 1 hour at 25° C., the solution was dehydrated at the oil vacuum. A pressed object, manufactured with 90 kN/cm² pressing power had a resistance coefficient of $3 \cdot 10^6$ ohm/cm.

For the purpose of comparison, the test was repeated without gelatine, whereby 28.5 g/l ammonia peroxidisulfate and 8.4 g/l pyrrole were used. A resistance value of 4.1 ohm/cm was measured, i.e., the electrical resistance of the pressed item which was manufactured without the addition of gelatine had a lower value by a factor of approximately 1000.

Example 25

A solution of 30 g/l gelatine with 6.7 g/l pyrrole resulted in a viscous liquid. The FR4 coupons treated with permanganate resulted in this in no visible polypyrrole layer, which would have been easy to recognize by the black color. The resistance coefficient was greater than $30 \cdot 10^6$ ohm.

For the following examples, water-soluble polymers or cationic polyelectrolyte, ammonia peroxidisulfate and pyrrole were added to an agitated phosphoric acid solution which had a pH value of 1 and a temperature between 5° and 10° C. After 1 hour the solution was filtered and the filter residue was washed out with an aqueous phosphoric acid solution (pH 1). The residue was then dried in the oil vacuum and partially processed to a pressed item at 90 kN/cm². The resistance coefficient was measured on the pressed item. The dried residue served for the purpose of elementary analysis.

Example 26

6.72 g/l pyrrole and 2.2.8 g/l ammonia peroxidisulfate were used. The measured carbon content of the residue was 40.1% by weight, the measured nitrogen content was 11.2 % by weight. From this is calculated an atomic ratio of carbon to nitrogen C/N of 4.16. The measured resistance coefficient was 2.0 ohm/cm.

Example 27

7.2 g/l pyrrole, 22.9 g/l ammonia peroxidisulfate and, in addition, 11.9 g/l polyethylene glycol 200 were used. The measured carbon content of the residue was 31.4% by weight, the measured nitrogen content was 8.8% by weight. From this is calculated an atomic ratio of carbon to nitrogen C/N of 4.16. The measured resistance coefficient was 1.0 ohm/cm.

The measured atomic ratio of carbon to nitrogen C/N shows that no incorporation of the polyethylene glycol occurred. To be sure, the electrical conductivity and the metallization, measured with the transmitted light test, were better than without additive (cf. Examples 23 and 26).

Example 28

6.7 g/l pyrrole, 22.8 g/l ammonia peroxidisulfate and, in addition, 202 g/l polyethylene glycol 200 were used. The measured carbon content of the residue was 37.8% by weight; the measured nitrogen content was 10.0% by weight. From this an atomic ratio of carbon to nitrogen C/N of 4.40 is calculated. The measured resistance coefficient was 4.7 ohm/cm.

The measured atomic ratio of carbon to nitrogen C/N shows that incorporation of the polyethylene glycol occurred.

Example 29

7.13 g/l pyrrole, 22.8 g/l ammonia peroxidisulfate and, in addition, 11.2 g/l polyvinyl pyrrolidone were used. The measured carbon content of the residue was 32.2% by weight; the measured nitrogen content was 8.5% by weight. From this an atomic ratio of carbon to nitrogen C/N of 4.42 is calculated. The measured resistance coefficient was 2.8 ohm/cm.

The measured atomic ratio of carbon to nitrogen C/N shows that incorporation of the polyvinyl pyrrolidone occurred.

Example 30

7.12 pyrrole, 22.9 g/l ammonia peroxodisulfate and, in addition, 11.6 g/l polyvinyl pyrrolidone were used. The measured carbon content of the residue was 32.6% by weight; the measured nitrogen content was 9.8% by weight. From this an atomic ratio of carbon to nitrogen C/N of 3.88 is calculated. The measured resistance coefficient was 1.3 ohm/cm.

The measured atomic ratio of carbon to nitrogen C/N shows that incorporation of the polyvinyl pyrrolidone occurred. The electrical conductivity was better than without the additive (cf. Example 26).

Example 31

6.7 pyrrole, 22.8 g/l ammonia peroxodisulfate and, in addition, 103 g/l polyvinyl pyrrolidone were used. The measured carbon content of the residue was 34.3% by weight; the measured nitrogen content was 9.7% by weight.

From this an atomic ratio of carbon to nitrogen C/N of 4.12 is calculated. The measured resistance coefficient was 3.8 ohm/cm.

Again in this case, the atomic ratio of carbon to nitrogen C/N shows that incorporation of the polyvinyl pyrrolidone occurred.

Example 32

Analogous to Example 2, a plastic workpiece of ABS copolymer was pre-treated with an alkali permanganate solution and, after rinsing, processed in a pyrrole solution containing a phosphoric acid. As in Example 2, a conductive black polypyrrole film formed, which then could be electro-copper-plated.

We claim:

1. A process for metallizing non-conductive surfaces, consisting essentially:

(a) treating the non-conductive surface with a solution containing at least one suspended or solute oxidation agent;

(b) contacting the treated non-conductive surface with an acidic solution containing
at least one water-soluble polymer, selected from the group consisting of homopolymers and copolymers, wherein each water-soluble polymer contains uncharged structural elements or is cationic polyelectrolyte and each water-soluble polymer undergoes protonizing/deprotonizing reactions, formation of hydrogen bridge compounds and van der Waals interactions, and
at least one aromatic compound, where the water-soluble polymer and the aromatic compound immediately chemically polymerize to form a conductive polymer; and (c) electroplating the conductive polymer.

2. The process of claim 1, wherein the solution of step (b) is adjusted to a pH of 0 to 4.

3. The process of claim 1, wherein the water-soluble polymer of step (b) contains one or more hydroxyl, amide, sulfonamide, amine, keto-enole, ether, keto, sulfoxide, quaternary ammonia or hetarinium groups.

4. The process of claim 1, wherein the water-soluble polymer of step (b) is selected from the group consisting of polyalkylene oxides, polyalkylene imines, polyvinyl pyridines, polyvinyl pyrrolidones, polymers produced from epihalohydrine and imidazoles or benzimidazoles, polymers produced from acrylic acid or methacrylic acid compounds derived with quaternary ammonia groups, poly(diallyldimethylammonia halogenide), quaternized polypiperidinium, compounds, polyamine sulfones, quaternized polyvinylimidazolium salts, quaternized polyvinylpyridinium salts and ionenes.

5. The process of claim 4, wherein the water-soluble polymer of step (b) is selected from the group consisting of polyethyleneimine
poly(N-methyl-ethyleneimine)
polyvinyl alcohol
polyethylene oxide
polypropylene oxide
copolymer of polyethylene oxide and polypropylene oxide
polyacrylic amide
poly-1-vinylpyrrolidone
poly(2-vinylpyridine)
poly(4-vinylpyridine)
polyethylene glycol
poly(N-methyl-N-vinylimidazolium methosulfate)
poly(N,N-dimethyl-3,5-dimethylene-piperidinium chloride)
poly((3-chlor-2-hydroxy-propyl)-1-imidazole) and
poly(N,N-diallyldimethylammonia chloride).

6. The process of claim 1, wherein the water-soluble polymer of step (b) is present in a concentration between 2 g/l and 250 g/l.

7. The process of claim 1, wherein the aromatic compound of step (b) is pyrrole, thiophene, aniline, N-phenyl-p-phenylene diamine or derivates thereof.

8. The process of claim 7, wherein the aromatic compound comprises at least one of 3- and 4-mono or disubstituted pyrrole derivates.

9. The process of claim 7, wherein the aniline derivate in at least one of the o- and m-position and the N-pheny-p-phenylene diamine derivate are substituted symmetrically or asymmetrically in the 2,2', 5,5', 3,3', 6,6' position and combinations thereof.

10. The process of claim 7, wherein the pyrrole derivate comprises linked monomer pyrroles in the 2,2' position.

11. The process of claim 10, wherein the pyrrole derivate is 2,2' bipyrrole.

12. The process of claim 7, wherein the thiophene derivate comprises linked monomer thiophenes in the 2,2' position.

13. The process of claim 12, wherein the thiophene derivate is 2,2' bithiophene.

14. The process of claim 1, wherein the oxidation agent is permanganate, manganate or brownstone.

15. The process of claim 1, wherein the solution of step (a) comprises permanganate in alkali hydroxide.

16. The process of claim 15, wherein the solution is at a temperature of from 80° C. to 100° C., resulting in manganate.

17. The process of claim 1, wherein the solution of step (a) comprises iron-III chloride in at least one from the group consisting of an organic solvent and water.

18. The process of claim 1, wherein the solution of step (b) is adjusted to a temperature of −10° C. to +30° C.

* * * * *